(12) United States Patent
Dunsmore et al.

(10) Patent No.: US 11,209,471 B2
(45) Date of Patent: Dec. 28, 2021

(54) REMOVING EFFECTS OF INSTABILITIES OF MEASUREMENT SYSTEM

(71) Applicant: Keysight Technologies, Inc., Santa Rosa, CA (US)

(72) Inventors: Joel P. Dunsmore, Sebastopol, CA (US); Gen Tokumoto, Hyogo (JP); Yasuaki Komatsu, Hyogo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 28 days.

(21) Appl. No.: 16/863,595

(22) Filed: Apr. 30, 2020

(65) Prior Publication Data
US 2021/0341526 A1   Nov. 4, 2021

(51) Int. Cl.
| G01R 35/00 | (2006.01) |
| G01R 27/28 | (2006.01) |
| G01R 27/02 | (2006.01) |
| G01R 27/26 | (2006.01) |
| G01R 31/319 | (2006.01) |

(52) U.S. Cl.
CPC .............. *G01R 27/28* (2013.01); *G01R 27/02* (2013.01); *G01R 27/2605* (2013.01); *G01R 31/3191* (2013.01); *G01R 35/00* (2013.01); *G01R 35/005* (2013.01); *G01R 35/007* (2013.01); *H01L 2924/00* (2013.01); *H01L 2924/0002* (2013.01)

(58) Field of Classification Search
CPC ...... G01R 35/005; G01R 35/00; G01R 27/28; G01R 27/02; G01R 27/2605; G01R 31/3191; G01R 35/007; H01L 2924/0002; H01L 2924/00

USPC .................... 324/76.11–76.83, 459, 600, 601
See application file for complete search history.

(56) References Cited

U.S. PATENT DOCUMENTS

| 7,777,497 B2 | 8/2010 | Albert-Lebrun et al. |
| 2004/0153265 A1* | 8/2004 | Martens ............... G01R 35/005 702/65 |
| 2016/0103197 A1 | 4/2016 | Schultz et al. |
| 2020/0103458 A1* | 4/2020 | Anderson .......... G01R 31/2822 |
| 2020/0103485 A1* | 4/2020 | Anderson .............. G01R 35/00 |

FOREIGN PATENT DOCUMENTS

CN        104215848 B        9/2016

OTHER PUBLICATIONS

English translation of CN104215848B, dated Sep. 21, 2016, 13 pgs.

* cited by examiner

*Primary Examiner* — Raul J Rios Russo

(57) ABSTRACT

A measurement system and a method of removing effects of instability of the measurement system while measuring at least one S-parameter of a device under test (DUT) are provided. The method includes initially determining a characteristic of the measurement system, including identifying a location of an instability in the time domain of the measurement system; determining a change of the characteristic of the measurement system while connected to the DUT; and compensating for the determined change of the characteristic of the measurement system while connected to the DUT by removing effects of the determined change on measurements of the at least one S-parameter of the DUT.

20 Claims, 3 Drawing Sheets

REMOVING EFFECTS OF INSTABILITIES OF MEASUREMENT SYSTEM

BACKGROUND

A vector network analyzer (VNA) is used to perform measurements of radio frequency (RF) signals in the frequency domain. VNAs enable accurate and stable measurements of S-parameters of device under test (DUTs), in particular, because of the nature of ratio measurements. To perform such measurements, a DUT is connected to a VNA system, which includes the VNA, test cables, and any connecting devices, such as adaptors, connectors and switches, for example. Some users, though, want to characterize DUTs with very high accuracy that is beyond the stability offered by a conventional VNA system.

Various conventional calibration techniques have been developed to improve accuracy of S-parameter measurements by VNA systems. However, these calibration techniques improve accuracy only at the time of the initial calibration. So, when characteristics of the VNA system change after calibration, for example, due to environmental variations in test cables and connecting devices, the changed characteristics degrade the accuracy and/or stability of subsequent measurements. Therefore, the user needs to recalibrate the VNA system after the characteristics have changed.

Recalibration may be difficult and time consuming, though, as it requires that the VNA system be detached from the DUT and connected to calibration standards. As a result, test cables and other connections need to be moved, causing instability of the VNA system. Other conventional calibration techniques may be easier to implement and otherwise avoid instability, but they require special hardware, which may be unavailable or expensive to purchase. One example of such a recalibration technique is provided by CalPod Calibration Refresh Modules ("CalPod"), available from Keysight Technologies, Inc. However, this technique requires additional hardware specific to CalPod be included in the VNA measurement system, which is expensive, and involves complicated additional initial calibration. Also, the DUT must be electrically disconnected in order to perform the recalibration.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
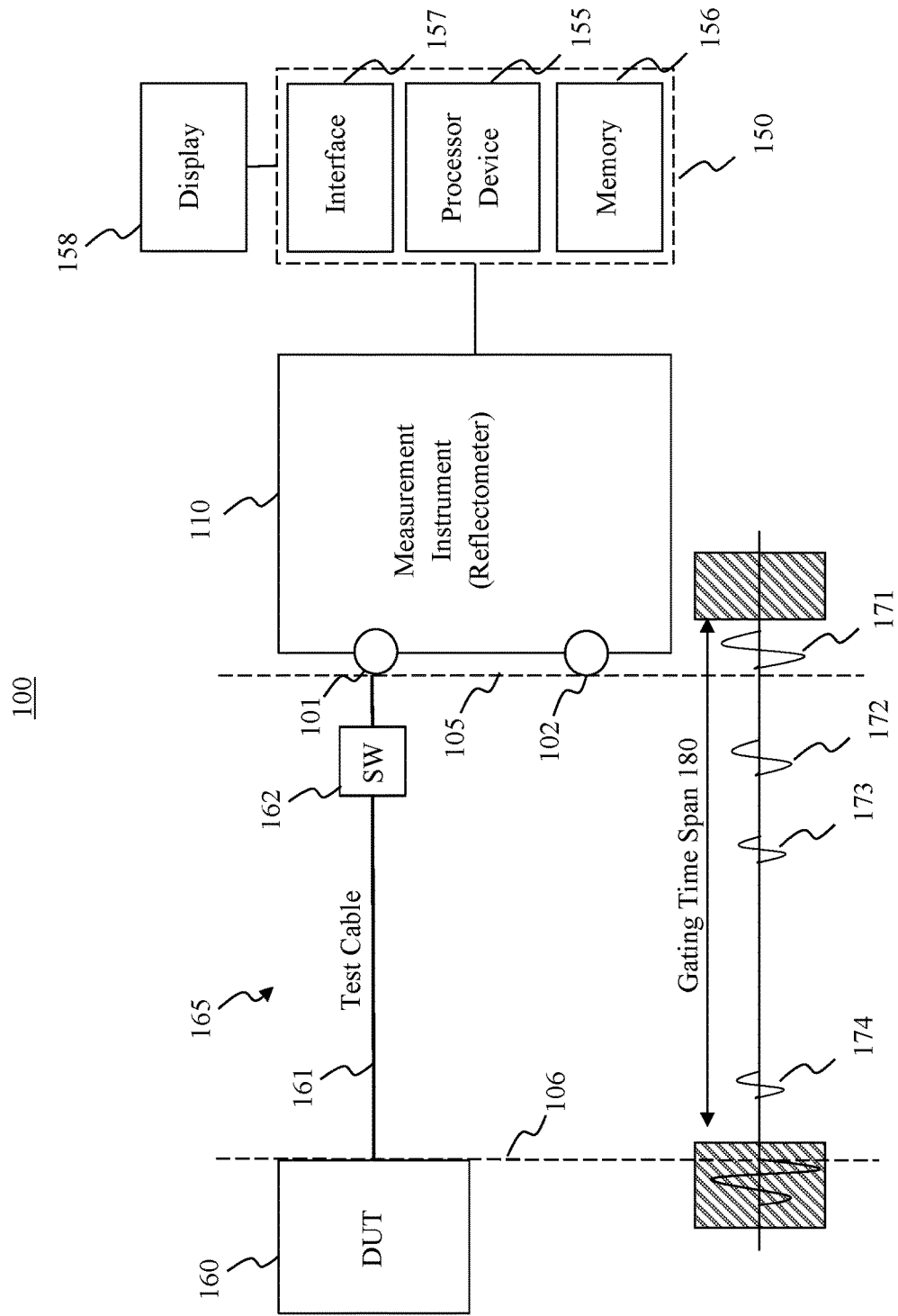
FIG. 1 is a simplified block diagram showing a measurement system for removing effects of instability measuring at least one S-parameter of a device under test (DUT), according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments are directed to methods and systems for removing effects of instabilities of a measurement system while measuring a device under test (DUT). The measurement system includes a measurement instrument and a connection circuit for connecting the measurement instrument to the DUT. The measurement instrument may be a reflectometer, such as a vector network analyzer (VNA) or a network analyzer, for example. The embodiments re-establish valid calibration at a measurement plane of the measurement instrument without having to disconnect the DUT or repeat initial calibration steps, thereby assuring that performance of the measurement system is not affected by changed characteristic from environmental variations and other factors.

According to a representative embodiment, a method is provided for determining an initial characteristic of the measurement system, connecting the measurement system to the DUT to measure at least one S-parameter of the DUT, for example, determining a change of the initial characteristic of the measurement system while connected to the DUT, and compensating for the determined change of the initial characteristic of the measurement system while connected to the DUT. Correction of the measurement system is enhanced, and highly stable measurements of the DUT are realized. This solution maintains accuracy of S-parameter measurements by compensating for changes of measurement system after calibration. The changes can be extracted with the DUT connected, without moving test cables of the measurement system, and without having to connect to calibration standards. Also, no additional hardware is required.

FIG. 1 is a simplified block diagram showing a measurement system for removing effects of instability while measuring at least one S-parameter of a device under test (DUT), according to a representative embodiment.

Referring to FIG. 1, a measurement system 100 includes a measurement instrument 110 and a connection circuit 165 for connecting the measurement instrument 110 to DUT 160. The measurement instrument 110 may be a reflectometer, such as a VNA a network analyzer or any other device capable of measuring S-parameters of the DUT 160, for example. The connection circuit 165 includes a test cable 161 (e.g., coaxial cables, waveguides, striplines, microstrips) and other connecting devices, indicated by a representative switch 162, although other types of connecting devices may be included, such as adaptors and connectors, for example. The measurement system 100 further includes a processing unit 150, which may be included in the measurement instrument 110 or may be separate from the measurement instrument 110 and connected by wired or wireless network connections, as would be apparent to one of ordinary skill in the art. The measurement system 100 may be connected to the DUT 160 in order to measure S-parameters of the DUT 160, for example.

The measurement instrument 110 of the measurement system 100 includes multiple ports for receiving the RF measurement signals, indicated by representative first port 101 to $m^t$ port 102, at measurement plane 105, where m is a positive integer indicating the total number of ports of the measurement instrument 110. In the depicted example, the first port 101 is shown connected to one port of the DUT 160 via the connection circuit 165 for purposes of measuring S-parameters of the DUT 160 at DUT measurement plane 106. However, it is understood that the DUT 160 may have multiple ports (e.g., two-port device), in which case at least one additional port (e.g., $m^{th}$ port 102) of the measurement instrument 110 would be connected to a corresponding at least one additional port of the DUT 160 to perform the S-parameter measurements. The processes described herein for removing effects of instability of the measurement system 100 while measuring the DUT 160 would be the same for each of the connection circuits between other ports of the measurement instrument 110 and the DUT 160.

The first port 101 and the $m^{th}$ port 102 are inputs to corresponding channels (not shown) for receiving and measuring radio frequency (RF) measurement signals from the DUT 160. Each channel may include dual couplers, dual mixers and dual analog to digital converters (ADCs), for example, to provide digitized measurement signals to the processing unit 150, as is known by one of ordinary skill in the art. The processing unit 150 performs additional processing, including for example, removing effects of instability of the measurement system 100 while measuring the DUT 160.

In the depicted embodiment, the processing unit 150 includes a processor device 155, memory 156, and an interface 157, and a display 158. The processor device 155, together with the memory 156, implements at least a portion of the method for removing effects of instability of the measurement system 100 while measuring the DUT 160, and may be configured to perform and/or control all or a portion of the steps of the process shown in FIG. 2, discussed below. In various embodiments, the processor device 155 may include one or more computer processors, digital signal processors (DSPs), central processing units (CPUs), graphics processing units (GPUs), remote application program interfaces (APIs), field-programmable gate arrays (FPGAs), application specific integrated circuits (ASICs), or combinations thereof, using any combination of hardware, software, firmware, hard-wired logic circuits, or combinations thereof. The processor device 155 may include its own processing memory for storing computer readable code (e.g., software, software modules, software engines) that enables performance of the various functions described herein.

The processing memory, and any other memory (and databases) described herein, may be various types of random access memory (RAM), read only memory (ROM) and/or other storage media, including flash memory, electrically programmable read-only memory (EPROM), electrically erasable and programmable read only memory (EEPROM), compact disk read only memory (CD-ROM), digital versatile disk (DVD), registers, latches, flip-flops, a hard disk, a removable disk, tape, floppy disk, blu-ray disk, or universal serial bus (USB) driver, or any other form of storage medium known in the art, which are tangible and non-transitory (e.g., as compared to transitory propagating signals). Memories may be volatile or non-volatile, secure and/or encrypted, unsecure and/or unencrypted, without departing from the scope of the present teachings. As mentioned above, the memory 156 is representative of one or more memories and databases, including the processing memory, as well as multiple memories and databases, including distributed and networked memories and databases.

The interface 157 may include a user interface and/or a network interface for providing information and data output by the processor device 155 and/or the memory 156 to the user and/or for receiving information and data input by the user. That is, the interface 157 enables the user to enter data and to control or manipulate aspects of the process of measuring periodic RF signals in the frequency domain, and also enables the processor device 155 to indicate the effects of the user's control or manipulation. The interface 157 may include one or more of ports, disk drives, wireless antennas, or other types of receiver circuitry. The interface 157 may further connect one or more user interfaces, such as a mouse, a keyboard, a mouse, a trackball, a joystick, a microphone, a video camera, a touchpad, a touchscreen, voice or gesture recognition captured by a microphone or video camera, for example.

The display 158 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 158 and/or the processor device 155 may include one or more display interface(s), in which case the display 158 may provide a graphical user interface (GUI) for displaying and receiving information to and from a user.

In an embodiment, an initial calibration at or before the DUT interface in the measurement system 100 may be performed. This is a standard calibration performed with the one or more of the first through $m^{th}$ ports 101-102 connected to a calibration standard (not shown) via the test cable 161 and the switch 162, as would be apparent to one of ordinary skill in the art. For example, the initial calibration may be a factory calibration. A factory calibration is performed before the test cable, but when there is no factory calibration, the initial calibration may be performed at the DUT interface. A test calibration is also done at the measurement plane 105 the DUT interface with the DUT 160 connected, e.g., for measuring S-parameters of the DUT 160. The test calibration is performed over stimulus conditions for a particular test that may differ from stimulus conditions of the initial calibration, such as narrower frequency range, wider frequency range, different power level and/or different number of points, for example. The initial calibration may be performed prior to or at the same time as the test calibration. Also, the test calibration may be the same as the initial calibration if the DUT test stimulus (e.g., frequency range, number of points) is sufficient to compute a time-domain response that has sufficient range and resolution to determine the temporal position of target instabilities. Initialization of the test, discussed below, is done under the conditions of the initial calibration and the test calibration. In another embodiment, though, the initial calibration of the DUT interface may be skipped, without departing from the scope of the present teachings, in which case uncalibrated measurements will be used.

Following calibration, the measurement system 100 is used to perform measurements of the DUT 160, such as measuring one or more S-parameters. However, the measurement system 100 includes various instabilities that may change while the measurement system 100 is performing the measurements as a result of changing test conditions, such as changes in ambient temperature and pressure. Instabilities are characteristics of the measurement system 100 that change over time, such as frequency and impedance drift in the measurement instrument 110 (reflectometer), drift and instability in the test cable 161, and/or repeatability errors in other components in the connection circuit 165, such as RF switches, adapters and connectors, for example, in response to the changing test conditions, such as environmental temperature, environmental pressure, movement of the test cable 161, and/or external vibration, for example. The instabilities affect the accuracy of the measurements by the measurement system 100. For example, the return loss ($S_{11}$) response from the DUT 160 measured by the measurement system 100 appears to change because of the instability of the measurement system 100.

The instabilities of the measurement system 100 are identified by the processing unit 150 at temporal locations in the time domain, and have corresponding physical locations. In FIG. 1, illustrative instabilities in the measurement system 100 are indicated by curves 171, 172, 173 and 174 between the first port 101 and the DUT 160. In particular, the instability introduced by the first port 101 is indicated by curve 171, the instability introduced by the switch 162 is indicated by curve 172, and the instability introduced by the test cable 161 is indicated by curves 173 and 174. The temporal locations of the instabilities may be determined based on physical locations of components, such test cables, switches, adapters and connectors, which are known to have repeatability errors, and/or may be determined in a time domain trace of a measured response of the DUT 160. For example, the temporal locations of the instabilities may be determined through use of a time domain transform of the frequency response $S_{11}$ measurement, looking for changes in the time domain trace due to instabilities. The time domain response before the DUT 160 may be viewed over an extended period to ascertain where instabilities will occur. In some cases, the DUT 160 may be measured of days or weeks of time, although even minutes or hours of observation may be sufficient to determine the location of the instabilities.

In order to remove effects of the instabilities of the measurement system 100 while measuring at least one S-parameter of the DUT 160, the processor device 155 in the processing unit 150 executes instructions stored in the memory 156, causing the processor device 155 to initially determine at least one characteristic of the measurement system 100, to store the initially determined at least one characteristic in the memory 156, to determine a change of the at least one characteristic of the measurement system 100 while still connected to the DUT 160, and to compensate for the determined change of the at least one characteristic while still connected to the DUT 160. The measurement system 100 measures the at least one S-parameter of the DUT 160 in a known manner, while removing the effects of the instabilities during the measurements.

More particularly, a characteristic of the measurement system 100 is initially determined independent of the DUT 160, and stored in the representative memory 156. The characteristic may be a measurement of return loss response or voltage standing wave ratio (VSWR) response of the DUT 160 for the first port 101, for example. The measurement may be the same as that being performed for testing the DUT 160, although only over the time domain portion that occurs before the DUT 160 (e.g., within a gating time span 180). The characteristic of the measurement system 100 may be initially determined with or without the DUT 160 attached to the measurement system 100. The return loss response, in particular, would be indicated by $S_{11}$ for the first port 101, $S_{22}$ for the second port (not shown), $S_{33}$ for the third port (not shown), and so on, as would be apparent to one of ordinary skill in the art.

In an embodiment, the characteristic is initially determined by identifying temporal locations of one or more instabilities in the time domain of the measurement system 100, such as the instabilities indicated by the curves 171, 172, 173 and 174, as discussed above. A gating time span 180 that covers the identified locations of the instabilities is set using time domain gating, and a gated response (e.g., return loss response or VSWR response) of the measurement system 100 is measured over the gated time span 180 in the frequency domain. The gating time span 180 extends from inside the measurement instrument 110 (in the first port 101) to a point arbitrarily short of the connection to the DUT 160, for correcting instability in both the measurement instrument 110 and the connection circuit 165. The measured gated response is the characteristic of the measurement system 100 as initially determined, and is stored in the representative memory 156. In the depicted example, the initially determined characteristic includes the instabilities of the first port 101, the test cable 161 and the switch 162 connected to the DUT 160.

Setting the gating time span 180 using time domain gating is well known to one of ordinary skill in the art. Generally, time domain gating includes selecting an area of interest of the measurement system 100 in a portion of the time domain, determining a time domain response in the selected area of interest, and removing unwanted responses outside the selected area of interest. The response in the selected area of interest may be provided in the frequency domain by performing an inverse fast Fourier transform (IFFT), for example. Thus, the time domain gating effectively multiplies the time domain response by a value of one over the area of interest, and by zero outside the area of interest, thereby isolating the time domain response and providing the corresponding frequency domain response without the effect of the unwanted responses outside of the gating time span 180. Accordingly, the time domain gating separates the response of the DUT 160 from the response of the instability of the measurement system 100, so that the DUT 160 does not need to be disconnected determining the characteristic, initially or otherwise.

After the initially determined characteristic of the measurement system 100 is stored, a change of the characteristic is determined while the measurement system 100 is physically and electrically connected to the DUT 160. The change of the characteristic results from the instabilities in the measurement system 100. In an embodiment, the change is determined by measuring another gated response of the measurement system 100 over the same gating time span 180 in the frequency domain while connected to the DUT 160. The measured another gated response is the characteristic of the measurement system 100 as subsequently determined, and may also be stored in the representative memory 156, for example. The change of the characteristic is then determined by comparing the subsequently determined characteristic to the stored initially determined characteristic.

The change of the characteristic is determined without having to disconnect the DUT 160 from the measurement system 100, and without having to reconnect calibration standards to the measurement system 100. Also, the determining of the change of the characteristic of the measurement system 100 may be triggered by various events. For example, the change of the characteristic may be determined before each measurement of the DUT 160, periodically with a constant time interval between determinations, and/or according to a timing selected by a user. Or, the change of the characteristic may be determined in response to detected changes in the test environment, such as changes in environmental temperature and/or pressure that exceed predetermined thresholds, for example.

Various measurement conditions may be applied to measure the gated response for initially determining the characteristic of the measurement system 100 and to measure the another gated response for subsequently determining the characteristic of the measurement system 100. Measurement conditions are conditions set in the measurement system 100 for performing a particular test, such as frequency span (e.g., using the widest frequency span) and IF bandwidth (e.g., using lower IF bandwidth to reduce noise effects), for example. The measurement condition may match the measurement condition used to perform the S-parameter measurements of the DUT 160 when the DUT 160 measurement condition is compatible with the requirements of the time domain gating. In this case, since the time domain gating uses windowing in the time domain and measurement results of the gated responses at frequencies near the beginning and end frequencies are distorted, it is better to use the widest possible frequency span of the measurement instrument 110 to perform the S-parameter measurements of the DUT 160.

As another example, the measurement condition is applied to another channel (correction channel) of the measurement instrument 110 for determining the characteristic of the measurement system 100 than the measurement channel used for performing the S-parameter measurements. Since each channel (meaning setup conditions, start/stop points, IF bandwidth) requires time to setup, it is faster to set up a measurement channel (e.g., having a center frequency of 1 GHz and a frequency span of 100 MHz) and a separate correction channel (e.g., having a starting frequency of 10 MHz, a stopping frequency of 26 GHz, and a step size of 10 MHz), and to switch between these channel rather than reset channel attributes. For example, a wider frequency range than the measurement condition used to perform the S-parameter measurements of the DUT 160 may be set to the correction channel of the measurement instrument 110. In this context, the correction channel is a separate instance of the measurement software object, with different attributes such as number of points or frequency span, which may be used to remember the initial settings in a software sense.

The measurement system 100 then compensates for the determined change of the characteristic by removing the effect of the change on the S-parameter measurements of the DUT 160, which may be accomplished in a variety of ways. For example, compensating for the determined change of the characteristic may include modifying error terms of the initial calibration of the measurement system 100 using the determined change, and correcting a measurement of the at least one S-parameter of the DUT 160 using the modified error terms. Other examples of compensating for the determined change include de-embedding the determined change from the measurement of the at least one S-parameter, or simply subtracting the determined change from the measurement of the at least one S-parameter of the DUT. Also, the determined change may be compensated for by adjusting a reference plane of the determined change to match the measured at least one S-parameter of the DUT 160, and compensating for the determined change using the adjusted reference plane, where the determined change is determined as a magnitude response of a delay offset. Adjustment of the reference plane may take the ratio of the response of the DUT reflection tracking (magnitude and phase). Although FIG. 1 shows one port (first port 101) connected to the DUT 160, it is understood that other ports of the measurement instrument 110 may likewise be connected to other ports of the DUT 160, so that the measurement system 100 may also compensate for the determined change of the characteristic for these other connections as well.

Figure 2:
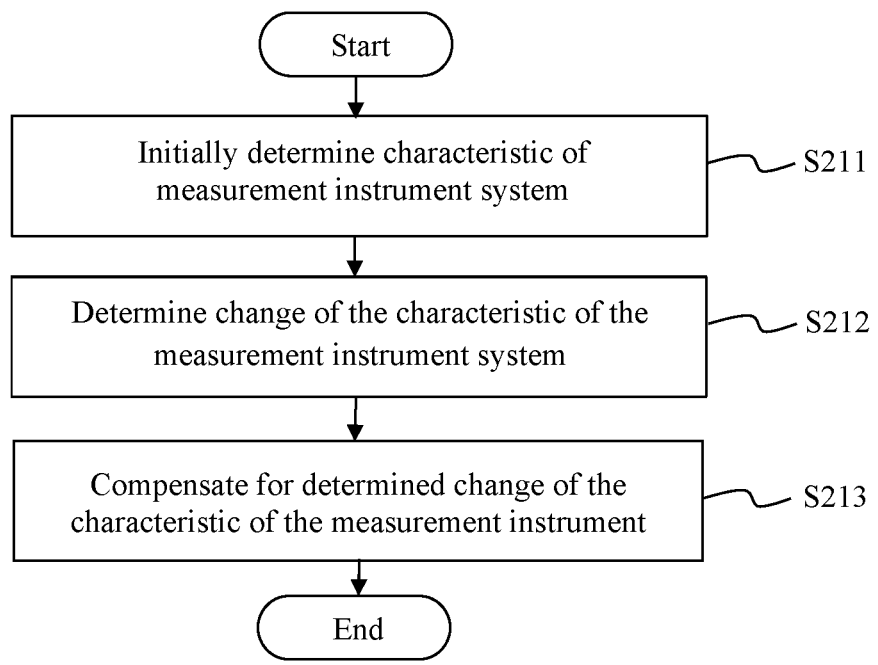
FIG. 2 is a simplified flow diagram showing a method of removing effects of instability of a system used for measuring at least one S-parameter of a DUT, according to a representative embodiment.

FIG. 2 is a simplified flow diagram showing a method of removing effects of instability of a system used for measuring at least one S-parameter of a DUT, according to a representative embodiment. The process shown in FIG. 2 may be implemented, at least in part, by a processing unit accessible by the system, such as the processing unit 150 described above. That is, a memory (156) of the processing unit is configured to store instructions that, when executed by a processor device (155) of the processing unit, cause the processing device to perform the steps discussed below.

Referring to FIG. 2, in block S211, a characteristic of the measurement system is initially determined. The measurement system includes a measurement instrument capable of measuring the at least one S-parameter of the DUT, such as a VNA, a network analyzer or a system analyzer, for example, as well as a connection circuit that connects the measurement instrument to the DUT, including at least a test cable. Initially determining the characteristic of the system may include identifying temporal locations of instabilities of the measurement system in the time domain, setting a gating time span that covers the identified locations of the instabilities using time domain gating, and measuring a gated response (e.g., return loss response or VSWR response) of the system over the gated time span in the frequency domain. The measured gated response is the initially determined characteristic of the measurement system, and may be stored by the measurement system.

In block S212, a change of the characteristic of the measurement system is determined, while the measurement system is connected to the DUT. The change of the characteristic is determined by measuring another gated response of the measurement system over the same gated time span as in block S211 in the frequency domain while remaining connected to the DUT. The measured another gated response is the characteristic of the measurement system as subsequently determined, and may also be stored. The change of the characteristic is then determined by comparing the subsequently determined characteristic to the initially determined characteristic. The change of the characteristic is determined without having to disconnect the DUT from the measurement system, without having to reconnect calibration standards to the measurement system, and without having to include another device in the connection circuit.

In block S213, the determined change of the characteristic of the measurement system is compensated for while the measurement system remains connected to the DUT. The compensation is performed by removing effects of the determined change on measurements of the at least one S-parameter of the DUT. As a result, the measurements made after changes caused by the instabilities will substantially match the measurements made prior to these changes, thereby compensating for changes in the test environment.

For example, a new compensated directivity term of the DUT calibration may be found from the change in the gated frequency domain response compensated for by dividing the change by the reflection tracking term. The result is then subtracted from the directivity error term of the DUT calibration, according to Equation (1):

$$EDF_{New} = EDF_{DUT} - \frac{\Delta S_{11\_Gated}}{ERF_{DUT}} \qquad \text{Equation (1)}$$

In Equation (1), $EDF_{New}$ is the compensated directivity on the DUT calibration, $EDF_{DUT}$ is the DUT calibration directivity error term before compensation, $ERF_{DUT}$ is the reflection tracking term of the DUT calibration before compensation and $\Delta S_{11\_Gated}$ is the change in the gated $S_{11}$ under the condition of the initial or factory calibration, whichever is used.

Figure 3A:
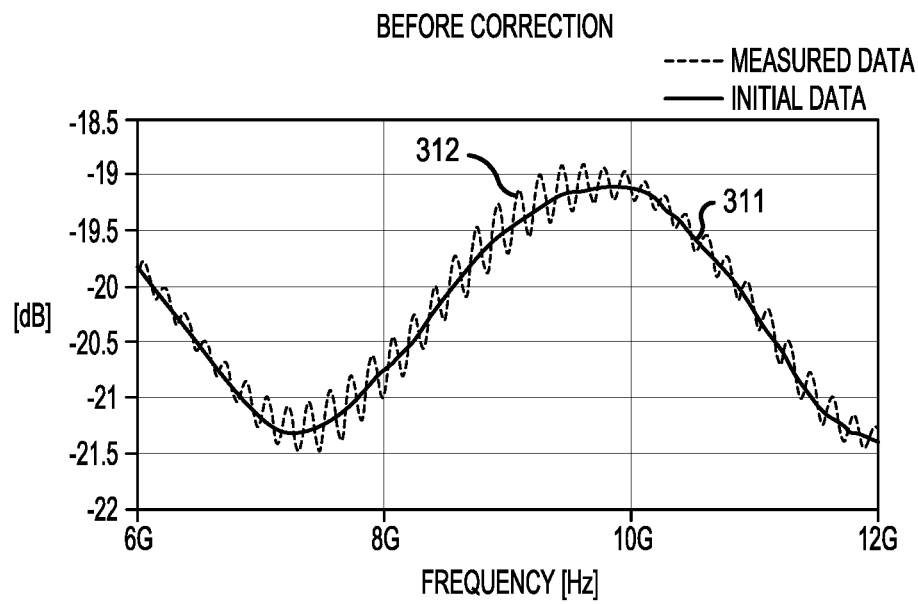
FIG. 3A is a graph showing return loss response of a DUT without removing the effects of instability of the measurement system.
Figure 3B:
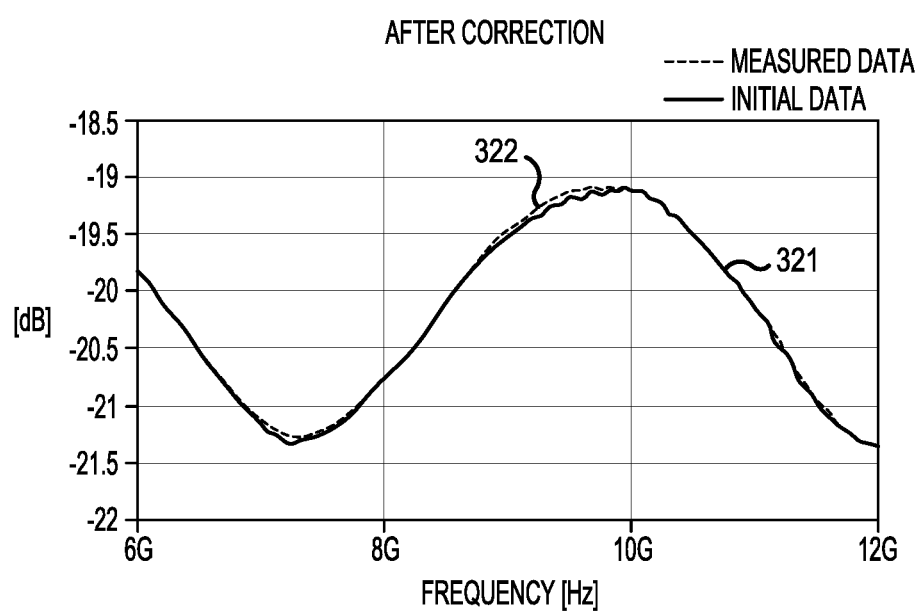
FIG. 3B is a graph showing return loss response of a DUT with removing the effects of instability of the measurement system, according to a representative embodiment.

FIG. 3A is a graph showing return loss responses of a DUT without removing the effects of instability of the measurement system, and FIG. 3B is a graph showing return loss responses of a DUT with removing the effects of instability of the measurement system, according to a representative embodiment.

Referring to FIG. 3A, trace 311 is an initial signal showing return loss ($S_{11}$) of a DUT (160) as measured by the measurement system (100) prior to changes in the test environment that cause instabilities in the measurement system. The initial signal is therefore unaffected by the instabilities. Trace 312 is a subsequent signal showing the return loss of the DUT as measured by the measurement system after a change in temperature of the test environment, for example, that causes instabilities in the measurement system. As shown, the measured signal is affected by these instabilities, indicated by the undesirable fluctuations in the trace 312a.

Referring to FIG. 3B, trace 321 is an initial signal showing return loss ($S_{11}$) of a DUT (160) as measured by the measurement system (100) prior to changes in the test environment that cause instabilities in the measurement system. Trace 322 is a subsequent signal showing the return loss of the DUT as measured by the measurement system after a change in temperature of the test environment that causes instabilities in the measurement system. However, the measurement system has removed the effects of the instabilities, according to the disclosed embodiments, resulting in the trace 322, which is substantially identical to the initial signal indicated by the trace 321. That is, the subsequent signal is unaffected by the instabilities of the measurement system, indicated by the absence of fluctuations in the trace 322.

While the invention has been illustrated and described in detail in the drawings and foregoing description, such illustration and description are to be considered illustrative or exemplary and not restrictive; the invention is not limited to the disclosed embodiments.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is no to be restricted except within the scope of the appended claims.

The invention claimed is:

1. A measurement system for measuring an S-parameter of a device under test (DUT), the measurement system comprising:
   a measurement instrument comprising at least one port and configured to receive a measurement signal from the DUT through the at least one port to perform a measurement of the S-parameter of the DUT;
   a connection circuit configured to connect the DUT to the at least one port of the measurement instrument; and
   a processing unit comprising a processor device and a memory for storing instructions that, when executed by the processor device, cause the processor device to:

initially determine a characteristic of the measurement system;

determine a change of the determined characteristic while the DUT is connected to the at least one port; and compensate for the determined change of the characteristic while the DUT is connected to the at least one port by removing effects of the determined change on the measurement of the S-parameter of the DUT.

2. The measurement system of claim 1, wherein the processor device initially determines the characteristic by:

identifying a location of an instability in a time domain of the measurement system;

setting a gating time span covering the identified location of the instability; and measuring a gated response of the measurement system over the gating time span in a frequency domain as the initially determined characteristic.

3. The measurement system of claim 2, wherein the processor device determines the change of the characteristic by:

measuring another gated response of the measurement system over the gating time span in the frequency domain as a subsequently determined characteristic while the DUT is connected to the at least one port; and calculating the change of the characteristic by comparing the subsequently determined characteristic to the initially determined characteristic.

4. The measurement system of claim 1, wherein the processor device compensates for the determined change by:

modifying error terms of an initial calibration of the measurement system using the determined change of the initially determined characteristic; and correcting a measurement of the S-parameter of the DUT using the modified error terms.

5. The measurement system of claim 1, wherein the processor device compensates for the determined change by:

de-embedding the determined change of the initially determined characteristic of the measurement system from a measurement of the S-parameter of the DUT.

6. The measurement system of claim 1, wherein the processor device compensates for the determined change by:

subtracting the determined change of the initially determined characteristic of the measurement system from a measurement of the S-parameter of the DUT.

7. The measurement system of claim 1, wherein the processor device compensates for the determined change by:

adjusting a reference plane of the determined change to match the measured S-parameter of the DUT; and compensating for the determined change using the adjusted reference plane, wherein the determined change is determined as a magnitude response and a delay offset.

8. The measurement system of claim 2, wherein the processor device identifies the location of the instability using an initial calibration of the measurement system.

9. The measurement system of claim 8, wherein the initial calibration is a factory calibration.

10. The measurement system of claim 8, wherein the initial calibration is performed prior to subsequent calibration for measuring the S-parameter of the DUT using a wider frequency range.

11. The measurement system of claim 8, wherein the initial calibration is performed at the same time as a calibration for measuring the S-parameter of the DUT using a wider frequency range.

12. The measurement system of claim 2, wherein the processor device identifies the location of the instability comprises using a time-domain response of an uncalibrated measurement to identify the instability in the time domain.

13. A method of removing effects of instability of a vector network analyzer (VNA) system measuring at least one S-parameter of a device under test (DUT) connected to the VNA system, the method comprising:

initially determining a characteristic of the VNA system;

determining a change of the characteristic of the VNA system while connected to the DUT; and compensating for the determined change of the characteristic of the VNA system while connected to the DUT by removing effects of the determined change on measurements of the at least one S-parameter of the DUT.

14. The method of claim 13, wherein initially determining the characteristic of the VNA system comprises:

identifying a location of an instability in a time domain of the VNA system;

setting a gating time span covering the identified location of the instability; and measuring a gated response of the VNA system over the gating time span in a frequency domain as the initially determined characteristic.

15. The method of claim 14, wherein determining the change of the characteristic comprises:

measuring another gated response of the VNA system over the gating time span in the frequency domain while connected to the DUT as a subsequently determined characteristic; and calculating the change of the characteristic by comparing the subsequently determined characteristic to the initially determined characteristic.

16. The method of claim 13, wherein compensating for the determined change comprises:

subtracting the determined change of the initially determined characteristic of the VNA system from a measurement of the at least one S-parameter of the DUT.

17. The method of claim 13, wherein compensating for the determined change comprises:

adjusting a reference plane of the determined change to match the at least one S-parameter of the DUT; and compensating for the determined change using the adjusted reference plane.

18. The method of claim 13, wherein determining the change of the initially determined characteristic of the VNA system while connected to the DUT, and compensating for the determined change while connected to the DUT, are performed before each measurement of the at least one S-parameter of the DUT.

19. The method of claim 13, wherein determining the change of the initially determined characteristic of the VNA system while connected to the DUT, and compensating for the determined change while connected to the DUT, are performed periodically at a constant time interval.

20. The method of claim 13, wherein determining the change of the initially determined characteristic of the VNA system while connected to the DUT, and compensating for the determined change while connected to the DUT, are performed in response to a change in a testing environment.

* * * * *